(12) United States Patent
Yano

(10) Patent No.: US 10,629,284 B2
(45) Date of Patent: Apr. 21, 2020

(54) SEMICONDUCTOR MEMORY DEVICE WITH A BUILT-IN SELF TEST CIRCUIT FOR ADJUSTING A MEMORY DEVICE PROPERTY

(71) Applicant: Winbond Electronics Corp., Taichung (TW)

(72) Inventor: Masaru Yano, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/826,698

(22) Filed: Nov. 30, 2017

(65) Prior Publication Data

US 2018/0166147 A1 Jun. 14, 2018

(30) Foreign Application Priority Data

Dec. 8, 2016 (JP) .................................. 2016-238199

(51) Int. Cl.
*G11C 29/38* (2006.01)
*G11C 16/30* (2006.01)
(Continued)

(52) U.S. Cl.
CPC ................ *G11C 29/38* (2013.01); *G11C 7/04* (2013.01); *G11C 7/20* (2013.01); *G11C 13/0033* (2013.01);
(Continued)

(58) Field of Classification Search
None
See application file for complete search history.

(56) References Cited

U.S. PATENT DOCUMENTS

2002/0144035 A1* 10/2002 Matsuo ..................... G06F 8/60
710/100
2010/0054019 A1* 3/2010 Toda ......................... G11C 8/12
365/148
(Continued)

FOREIGN PATENT DOCUMENTS

JP  H10334073  12/1998
JP  2008041704  2/2008
(Continued)

OTHER PUBLICATIONS

Office Action of Taiwan Counterpart Application, dated Jun. 4, 2018, pp. 1-8.

(Continued)

*Primary Examiner* — J. H. Hur
(74) *Attorney, Agent, or Firm* — JCIPRNET

(57) ABSTRACT

A semiconductor device preventing reduction of reliability due to the impact of heat after shipment is provided. A semiconductor device of the disclosure includes a built-in self-test circuit 110 and a resistive random-access memory. The built-in self-test circuit 110 includes a reforming information setting part 230 for performing reforming of the resistive random-access memory. When the operation of a forming execution part 220 or a test execution part 210 is performed, a flag is set to "1" for the reforming information setting part 230. Moreover, when a power supply mounted on a circuit board by IR reflow is turned on, the built-in self-test control part 200 references the flag of the reforming information setting part 230, and if the flag is "1", then the forming execution part 220 executes the reforming of the resistive random-access memory.

9 Claims, 7 Drawing Sheets

(51) Int. Cl.
   *G11C 16/10*    (2006.01)
   *G11C 13/00*    (2006.01)
   *G11C 29/02*    (2006.01)
   *G11C 7/20*     (2006.01)
   *G11C 29/12*    (2006.01)
   *G11C 7/04*     (2006.01)
   *G11C 29/04*    (2006.01)

(52) U.S. Cl.
   CPC .......... *G11C 13/0069* (2013.01); *G11C 16/10* (2013.01); *G11C 16/30* (2013.01); *G11C 29/02* (2013.01); *G11C 29/021* (2013.01); *G11C 29/028* (2013.01); *G11C 29/12* (2013.01); *G11C 2013/0083* (2013.01); *G11C 2029/0407* (2013.01)

(56) References Cited

U.S. PATENT DOCUMENTS

| | | | |
|---|---|---|---|
| 2010/0232208 A1* | 9/2010 | Maejima | G11C 13/0004 365/148 |
| 2012/0069626 A1* | 3/2012 | Nakano | G11C 13/0033 365/148 |
| 2014/0173344 A1 | 6/2014 | Kang et al. | |
| 2014/0210514 A1* | 7/2014 | Lin | H03K 19/1776 326/41 |
| 2016/0099078 A1* | 4/2016 | Luo | G11C 29/46 365/51 |
| 2016/0276009 A1 | 9/2016 | Lee et al. | |

FOREIGN PATENT DOCUMENTS

| | | |
|---|---|---|
| JP | 2008262623 | 10/2008 |
| JP | 2010160724 | 7/2010 |
| JP | 2012064283 | 3/2012 |
| JP | 2012064286 | 3/2012 |
| JP | 2015056191 | 3/2015 |
| JP | 2016176843 | 10/2016 |
| TW | 201126182 | 8/2011 |
| TW | I475663 | 3/2015 |

OTHER PUBLICATIONS

"Office Action of Korea Counterpart Application", dated Dec. 12, 2018, with English translation thereof, pp. 1-13.

* cited by examiner

SEMICONDUCTOR MEMORY DEVICE WITH A BUILT-IN SELF TEST CIRCUIT FOR ADJUSTING A MEMORY DEVICE PROPERTY

CROSS-REFERENCE TO RELATED APPLICATION

This application claims the priority benefit of Japan application serial no. 2016-238199, filed on Dec. 8, 2016. The entirety of the above-mentioned patent application is hereby incorporated by reference herein and made a part of this specification.

BACKGROUND

Technical Field

The disclosure relates to a semiconductor device having a built-in self-test (BIST) circuit, and more particularly, to a BIST circuit of a semiconductor device including a non-volatile memory such as a resistive random-access memory or a flash memory.

Related Art

The BIST circuit is one of the setting techniques simplifying tests of, for instance, memories or logic circuits. In general, the BIST circuit has, for instance, a circuit generating a test pattern, a circuit comparing the test result and an expected value, and a circuit outputting pass or fail as the comparison result (such as patent literature 1). Moreover, the BIST circuit of patent literature 2 discloses a technique: a switch is connected between a BIST logic circuit and a memory, and when the memory is accessed via the switch, the BIST logic circuit bypasses a memory controller logic circuit. The semiconductor device of patent literature 3 discloses a self-diagnostic control circuit that can change the scan-in period, scan-out period, or capture period to inhibit changes in current consumption during the BIST execution process.

Moreover, in a non-volatile semiconductor memory, the NAND or NOR flash memory had been implemented, and for the non-volatile memory replacing the flash memory, the implementation of a resistive random-access memory adopting a variable resistance element is also being advanced. The resistive random-access memory applies a pulse voltage via a thin film such as metal oxide such as hafnium oxide (HfOx) such that the resistance of the film is changed in a reversible and non-volatile manner to store data (such as patent literature 4 and patent literature 5).

FIG. 1 is a circuit diagram of a traditional structure of a memory array of a known resistive random-access memory. One memory cell unit includes a variable resistance element and a transistor connected in series thereto for access. An m×n (in and n are integers of 1 or more) number of cell units form a 2D array, and the gate of the transistor is connected to a word line, the drain region is connected to one of the electrodes of the variable resistance element, and the source region is connected to a source line. The other electrode of the variable resistance element is connected to a bit line.

The variable resistance element can set the resistance value to a low-resistance state or a high-resistance state in a reversible and non-volatile manner according to the size and polarity of the applied pulse voltage. The case in which the variable resistance element is set to (or written into) a high-resistance state is referred to as SET, and the case in which the variable resistance element is set to (written into) a low-resistance state is referred to as RESET.

The cell unit is selected via the word line, bit line, and source line in units of bits. For instance, during the writing of a cell unit M11, the transistor is turned on (ON) via a word line WL1, and a voltage corresponding to the SET or RESET is applied to a bit line BL1 and a source line SL1. Therefore, the variable resistance element is SET or RESET. During the reading of the cell unit M11, the transistor is turned on via the word line WL1, and a voltage for reading is applied to the bit line BL1 and the source line SL1. On the bit line BL1, a voltage or current corresponding to the SET or RESET of the variable resistance element is present, and the voltage or current is detected by a sensing circuit.

CURRENT TECHNICAL LITERATURE

Patent Literature

Patent literature 1: JP 2015-561191
Patent literature 2: US2014/0173344
Patent literature 3: JP 2016-176843
Patent literature 4: JP 2012-64286
Patent literature 5: JP 2008-41704

For a resistive random-access memory, the initial setting needs to form the metal oxide of a variable resistance element. In general, the forming includes applying a forming voltage Vf slightly greater than the voltage of the variable resistance element during data writing to the electrodes to form a filament current path between the electrodes. The polarity of the SET and RESET is decided according to the direction of the flowing current when the forming voltage Vf is applied. Such forming is performed before the resistive random-access memory is shipped.

FIG. 2 shows a cell unit structure maintaining complementary data in a pair of variable resistance elements. This is an example of forming in the cell unit structure. For instance, 0 V is applied to a bit line BL and a bit line BLb, a forming voltage (such as 4 V) is applied to a common source line BSL, and a voltage (such as 6 V) required to turn on a transistor T1 and a transistor T2 is applied to a word line WL. Therefore, in a variable resistance element R1, current flows from the common source line BSL toward the bit line BL, and in a variable resistance element R2, current flows from the common source line BSL toward the bit line BLb. During forming, the variable resistance element R1 and the variable resistance element R2 are in a high-resistance state, i.e., a SET state. When the variable resistance element R1 and the variable resistance element R2 are RESET, a bias voltage of BSL>BL and BSL>BLb is applied, and when the variable resistance element R1 and the variable resistance element R2 are SET, a bias voltage of BSL<BL and BSL<BLb is applied. The connection of a variable resistance element having such polarity is also referred to as back-to-back connection.

Moreover, in a surface-mount semiconductor device, a plurality of external terminals (such as ball-grid array (BGA), chip-sized package (CSP), or land-grid array (LGA)) arranged in 2D is formed in the bottom of a package, or a plurality of external terminals (plastic-leaded chip carrier (PLCC) or quad flat J-leaded package (QFJ)) extended from the side of the package toward the bottom is formed. When the surface-mount semiconductor device is mounted on a circuit board, IR reflow is applied, wherein in the IR reflow, the external terminals of the semiconductor device and a land (conductive pad region) of the circuit board are aligned and IR is irradiated on the entire body to melt the solder provided to the external terminals and/or land in advance.

In IR reflow, the external terminals are heated to a degree where the solder can be melted, and an increase in the localized temperature sometimes negatively affects the chip in the package sealed by, for instance, a resin. For instance, in a resistive random-access memory, as described above, the initial setting includes forming with the variable resistance element in a high-resistance state (SET state), but if high temperature is applied during IR reflow, then the width of the filament current path between the electrodes becomes narrow (smaller cross section area). As a result, the resistance of the formed variable resistance element is sometimes higher than the expected resistance. If the resistance during forming is higher than necessary, then the following issue exists: the SET/RESET cycling characteristic of the variable resistance element is degraded, such that endurance characteristic is reduced.

Moreover, the rise in localized temperature caused by IR reflow sometimes also affects other non-volatile memories. For instance, in a memory device retaining charge in a charge accumulation layer such as a floating gate, if the temperature of the charge accumulation layer is high, then charge is leaked from therein such that the initial state is changed. For instance, the initial value of the program voltage or the initial value of the erase voltage of a flash memory is shifted from the optimal value. Therefore, the following issue exists: the number of applications of the programming pulse or the number of applications of the erase pulse is increased, the reliability of programming or erasing is reduced, or endurance characteristic is lowered.

SUMMARY

The disclosure solves the known issues, and the object thereof is to provide a semiconductor device preventing reduction in reliability caused by the impact of heat after shipping.

The adjustment method of a semiconductor device including a BIST circuit of the disclosure includes a setting step setting an information of whether to adjust a property of the semiconductor device when the BIST circuit is in operation; a detection step detecting a turned on situation of the power supply; and an adjustment step responding to the detection step and adjusting the property of the semiconductor device based on the information set in the setting step.

Preferably, when the property of the semiconductor device is adjusted via the BIST circuit, the setting step automatically sets the information of adjusting the property of the semiconductor device. Preferably, the detection step detects an initial power on of a power supply mounted on a circuit board. Preferably, the setting step sets the information based on the test result of the BIST circuit. Preferably, the semiconductor device includes an external terminal to be surface-mounted on the circuit board. Preferably, the external terminal is reflowed to the conductive region of the circuit board. Preferably, the adjustment step is a forming step of a reversible and non-volatile resistive random-access memory. Preferably, in the adjustment step, the initial value of the programming pulse voltage of the non-volatile memory having a charge accumulation layer on the channel is adjusted. Preferably, in the adjustment step, the initial value of the erase pulse voltage of the non-volatile memory having a charge accumulation layer on the channel is adjusted.

The semiconductor device including a BIST circuit of the disclosure includes a setting part setting an information of whether to adjust a property of the semiconductor device when the BIST circuit is in operation; a detection part detecting the situation of a power supply; and an adjustment part adjusting the property of the semiconductor device based on the information set by the setting part when the detection part detects the power supply is turned on.

Preferably, the setting part automatically sets an information used for adjusting the property of the semiconductor device again when the property of the semiconductor device is adjusted. Preferably, the BIST circuit includes the detection part and the adjustment part. Preferably, the semiconductor device includes an external terminal to be surface-mounted on the circuit board. Preferably, the semiconductor device includes a resistive random-access memory storing data for a reversible and non-volatile variable resistance element, and the adjustment part is used for forming a circuit path between the electrodes of the variable resistance element. Preferably, the semiconductor device includes a non-volatile memory storing data in a charge accumulation region on a channel, and the adjustment part adjusts the initial value of the programming pulse voltage accumulating charge in the charge accumulation region. Preferably, the adjustment part further adjusts an initial value of an erase pulse voltage erasing charge from the charge accumulation region.

According to the disclosure, when the BIST circuit is in operation, information of whether the properties of the semiconductor device are adjusted is set, and when the power supply is turned on, the properties of the semiconductor device are adjusted based on the set information. Therefore, even after the product of the semiconductor device is shipped and the properties are changed by the impact of heat during the mounting of the semiconductor device on the circuit board (such as IR reflow during surface mounting), the changed properties can still be adjusted again, or the changed properties can be accommodated. Therefore, reduction in the reliability of the semiconductor device can be inhibited.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Hereinafter, the embodiments of the disclosure are described in detail with reference to figures. In a preferred form, the semiconductor device of the disclosure has the function of executing a built-in self-test for a circuit in the semiconductor device. In a more preferred form, the semiconductor device of the disclosure includes a memory such as a resistive random-access memory or a flash memory. In a more preferred form, the semiconductor device of the disclosure has an external terminal that can be surface-mounted on a circuit board.

EMBODIMENTS

Figure 1:
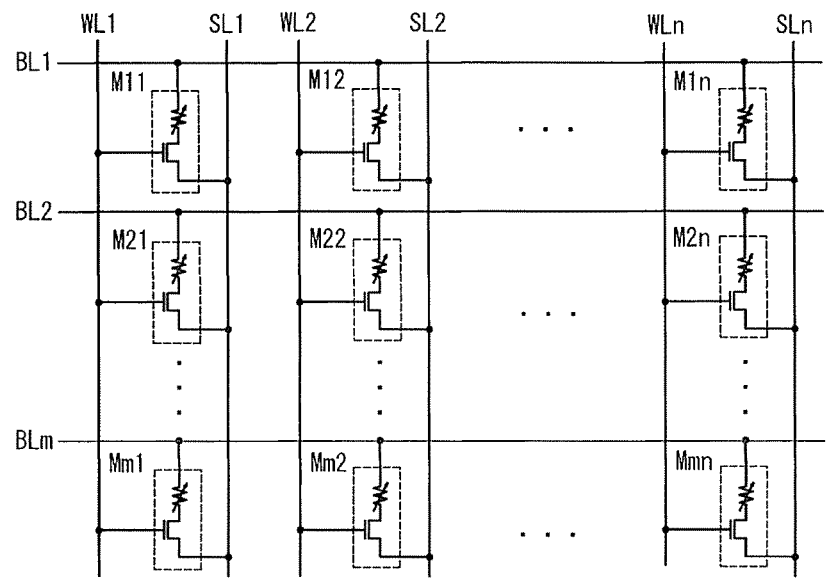
FIG. 1 is a figure of an array structure of a known resistive random-access memory.
Figure 2:
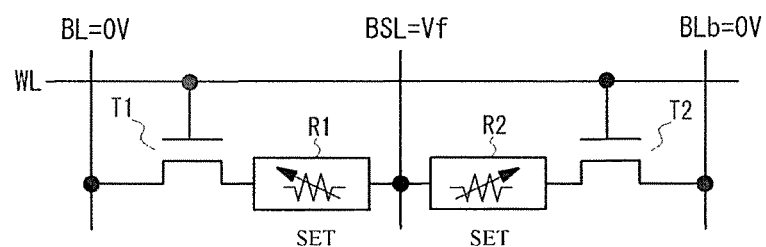
FIG. 2 is a graph of the forming of a known cell unit.
Figure 3:
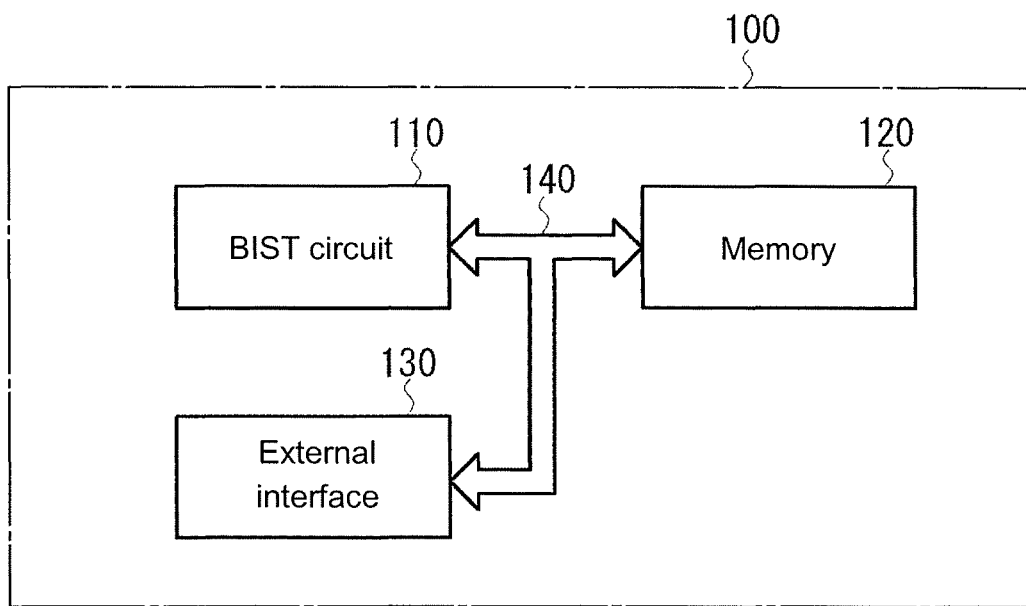
FIG. 3 is a graph of an example of a semiconductor device of an embodiment of the disclosure.

FIG. 3 is a block diagram of a general structure of a semiconductor device of an embodiment of the disclosure. A semiconductor device 100 includes a BIST circuit 110, a memory 120, an external interface 130, and an internal bus 140 connected to the above. The memory 120 of the present embodiment is formed by including the resistive random-access memory shown in FIG. 1 or FIG. 2. The BIST circuit 110 includes the function of performing a self-test on the memory 120 or other internal circuits that can execute a test of the memory 120 or the internal circuits at the wafer level, chip level, or package level.

The external interface 130 provides electrical connection to the semiconductor device 100 and an external device. When the external interface 130 is chip level or a bare chip before the semiconductor device 100 is packaged, electrical connection with the outside is provided by a chip or an electrode pad on the chip, and after the semiconductor device 100 is packaged, electrical connection with the outside is provided by a packaged external terminal.

Figure 4:
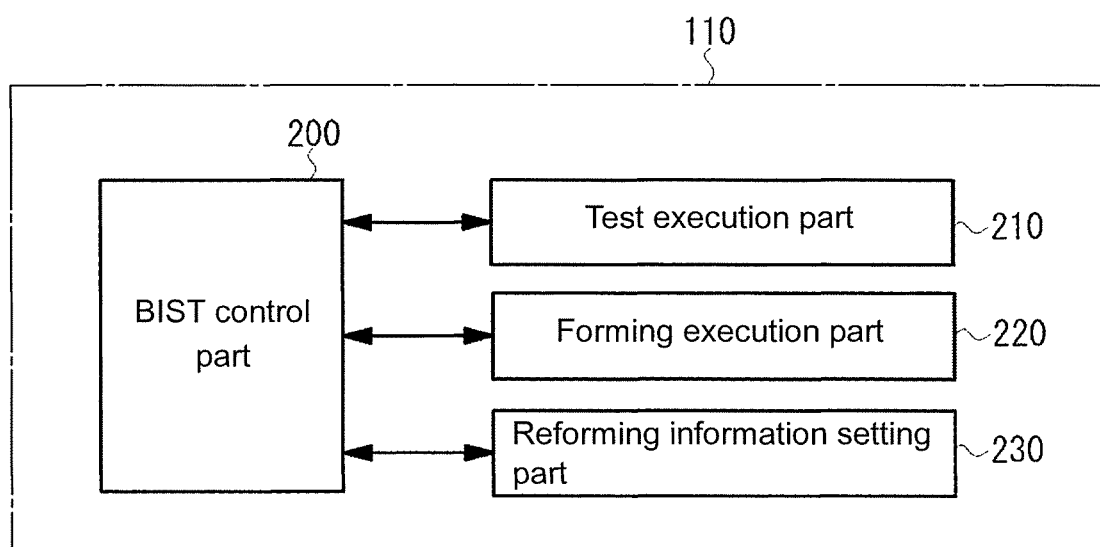
FIG. 4 is a graph of the inner structure of a BIST circuit of the first embodiment of the disclosure.

FIG. 4 represents a structure of a BIST circuit of the present embodiment. The BIST circuit 110 includes a BIST control part 200, a test execution part 210, a test execution part 210, a forming execution part 220, and a reforming information setting part 230. The BIST control part 200 controls the test execution part 210, the forming execution part 220, and the reforming information setting part 230. The BIST control part 200 executes a program or a state machine used for controlling each part, or starts the control circuit.

In an example, the BIST control part 200 operates in response to the situation of the input of an enabling signal by the external interface 130 to make the test execution part 210 execute a test of the memory 120 or a peripheral logic circuit. The test execution part 210 includes, for instance, a test pattern generation part generating a test pattern and a determination part determining pass or fail by comparing the result of the operation using the test pattern and an expected value. The BIST control part 200 can output the pass or fail determination result to the outside via the external interface 130.

Moreover, the BIST control part 200 makes the forming execution part 220 execute the forming of the resistive random-access memory. The forming execution part 220 controls, for instance, a word line selection circuit, line selection circuit, and voltage generation circuit in the memory 120 and applies a forming voltage Vf to the electrodes of the selected variable resistive element to form a high resistance state (SET) current path between the electrodes. Preferably, the BIST control part 200 makes the forming execution part 220 operate before the test execution part 210 but is not limited thereto, and can also make the forming execution part 220 operate after the test execution part 210 is in operation. Furthermore, the BIST control part 200 can also select any operation in the test execution part 210 or the forming execution part 220 according to an enabling signal from the external interface 130.

The BIST control part 200 of the present embodiment can make the forming execution part 220 execute forming twice. The first is before the semiconductor device 100 is shipped and the second is after the semiconductor device 100 is shipped and the semiconductor device 100 is mounted on the circuit board and the power supply is turned on for the first time. Whether the second forming is performed is decided according to the information set by the reforming information setting part 230. For instance, the reforming information setting part 230 sets the flag to "1" or "0", and at this point, the setting of "1" of the flag indicates the second forming is to be executed, and the setting of "0" of the flag indicates the second forming is not to be executed.

In an example, when the BIST control part 200 executes the first forming before shipping, the BIST control part 200 can respond to the situation and automatically set the flag of the reforming information setting part 230 to "1". Moreover, in another example, the BIST control part 200 can respond to the input signal from the external interface 130 and set the flag of the reforming information setting part 230 to "1". Therefore, the BIST control part 200 can set the flag of the reforming information setting part 230 from "1" to "0". In an example, the BIST control part 200 can set the flag to "0" when a power supply mounted on the circuit board is turned on for the first time and a second forming is executed. In another example, the BIST control part 200 can respond to the input signal from the external interface 130 and set the flag from "1" to "0".

The BIST control part 200 references the flag of the reforming information setting part 230 when the power supply mounted on the circuit board is detected to be turned on for the first time, and if the flag is "1", then the second forming is executed via the forming execution part 220. Whether the power supply is turned on can be determined by the detection of a supply voltage Vdd or the detection of a power-up signal or a RESET signal provided along with the Vdd.

Figure 5:
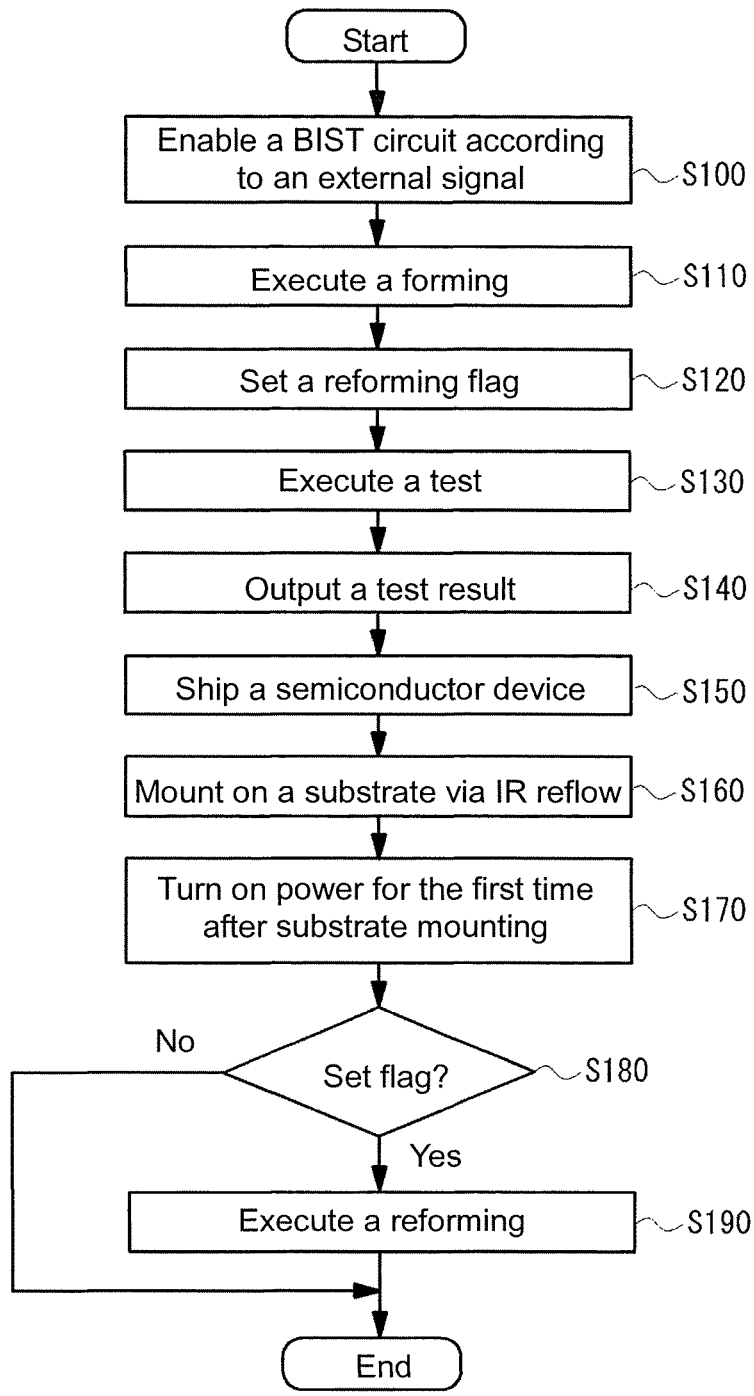
FIG. 5 is a flow chart of the operation related to the forming of the first embodiment of the disclosure.

Next, the forming method of the semiconductor device of the present embodiment is described with reference to the process of FIG. 5. After the manufacture of the integrated circuit of the semiconductor device 100, the BIST control part 200 is enabled according to the enabling signal (S100). Next, the BIST control part 200 makes the forming execution part 220 execute the forming of the memory 120 as the initial setting of the memory 120 (S110). After the BIST control part 200 performs the forming via the forming execution part 220, the flag of the reforming information setting part 230 is set to "1" (S120). Next, the BIST control part 200 makes the test execution part 210 execute a test of the memory 120 and/or logic circuit (S130). The test result of the BIST circuit 110 is outputted from the external interface 130 (S140) and a semiconductor device 100 that is determined to pass is shipped (S150).

Next, the shipped semiconductor device is mounted on a circuit board via IR reflow (S160). Next, after the mounting on the circuit board and the semiconductor device 100 is powered on for the first time (S170), the BIST control part 200 executes a power-up sequence, and here, whether the reforming information setting part 230 has a flag of "1" is determined (S180), and when the flag is set to "1", the forming execution part 220 executes the reforming of the memory 120 (S190).

When the semiconductor device is surface-mounted on the circuit board, an external terminal of the semiconductor device and a land of the circuit board are positioned, and the solder provided to the external terminal and/or land is melted by IR reflow. In the step, the external terminal needs to be heated to the temperature of solder melting, but the localized temperature is conducted to a thin and compact variable resistance element of the package interior, and therefore the phenomenon of narrowing of the cross-section area of the current path formed between the electrodes sometimes occur. In the present embodiment, reforming is performed after the semiconductor device is mounted on the circuit board such that the current path between the electrodes of the variable resistance element can be corrected to the optimal e. The result shows that, the reliability and endurance characteristics of the variable resistive element can be improved.

Moreover, in the embodiment, an example of surface mounting via IR reflow is shown, but the disclosure is not limited to infrared ray, and applying heat to an external terminal via other methods to perform surface mounting is also suitable for the disclosure.

Figure 6:
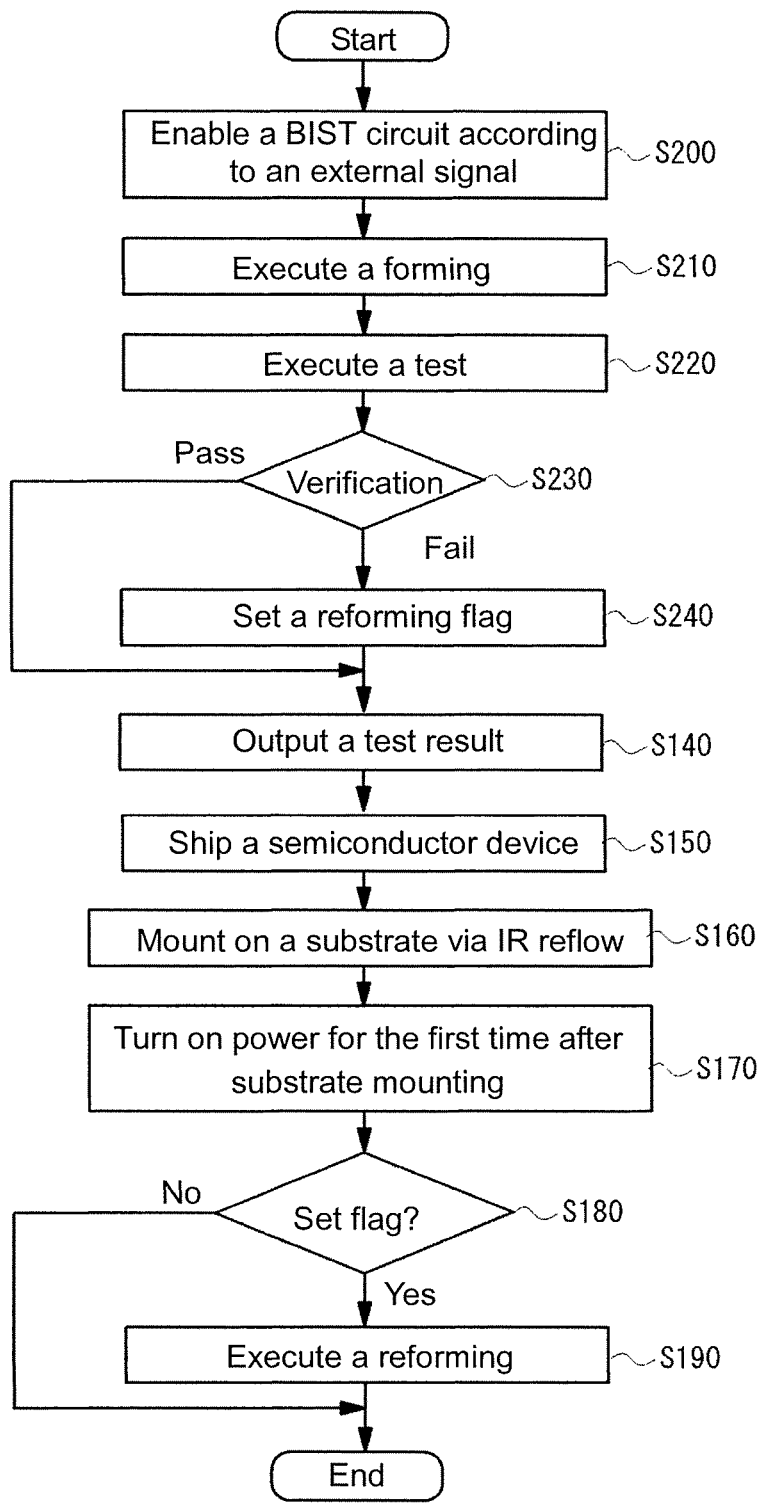
FIG. 6 is a flow chart of the forming operation of the second embodiment of the disclosure.

Next, the process of FIG. 6 shows the forming method of the second embodiment of the disclosure. In the second embodiment, the flag setting of the reforming setting part 230 is performed according to the verification from the test of the test execution part 210. First, the BIST circuit 110 is enabled (S200) and the forming of the resistive random-access memory is executed via the forming execution part 220 (S210). Next, a test is executed via the test execution part 210 (S220). The test execution part 210 detects the resistance of the formed resistive random-access memory and compares the resistance and a threshold to perform the verification of the formed resistance (S230). If the resistance is higher than the threshold, then the expected resistance is further increased due to the heating caused by the IR reflow when surface mounting is performed on the semiconductor device 100 such that endurance characteristics are degraded, thus resulting in fail. At this point, the flag of the reforming information setting part 230 is set to "1" (S240). Moreover, when the resistance is less than the threshold, even if the resistance is expected to be increased due to the heating caused by IR reflow, the degradation of the endurance characteristics is still within the acceptable range, thus resulting in pass. At this point, the BIST control part 200 does not set the flag of the reforming information setting part 230 to "1". Hereinafter, the process up to step S140 to step S190 is the same as the process of FIG. 5 and is therefore not repeated.

Therefore, according to the present embodiment, the influence of IR reflow is predicted according to the forming result of the resistive random-access memory, and the flag of the reforming information setting part 230 is set based on the predicted result. If not needed, then the execution of the second forming is skipped so as to suitably determine whether to perform the second forming.

Figure 7:
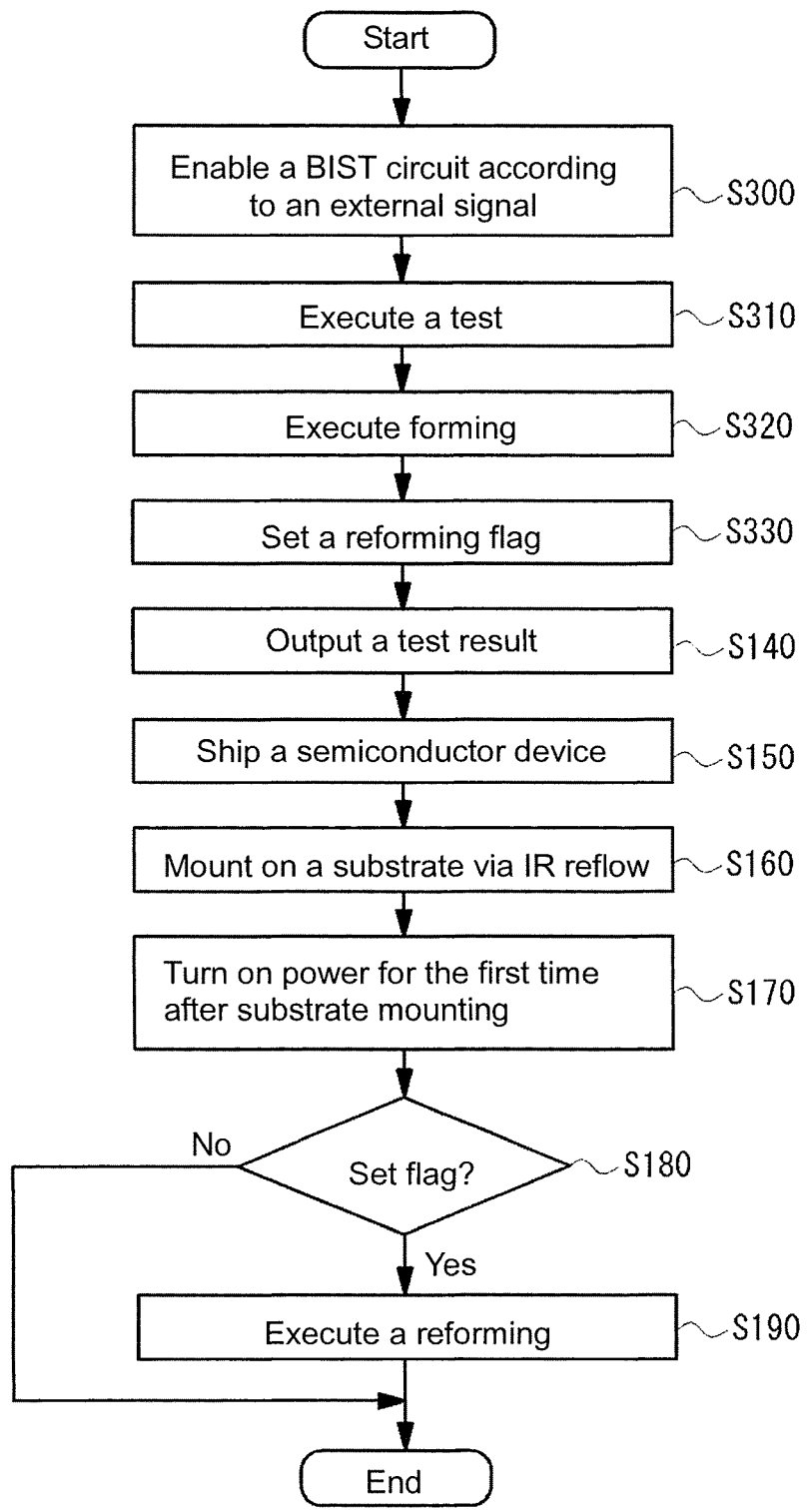
FIG. 7 is a flow chart of the forming operation of the third embodiment of the disclosure.

FIG. 7 is the process of the forming method of the third embodiment of the disclosure. The third embodiment is different from the first embodiment in that the forming of the memory 120 and the information setting of the reforming information setting part 230 are performed after the test of the internal circuit of the semiconductor device 100 is executed, and other than this, the processing flow is the same as that of the first embodiment. At this point, the BIST control part 200 performs the following sequence control: the test execution part 210 executes a test, then the forming execution part 220 executes a forming, and then the flag of the reforming information setting part 230 is set to "1".

Figure 8:
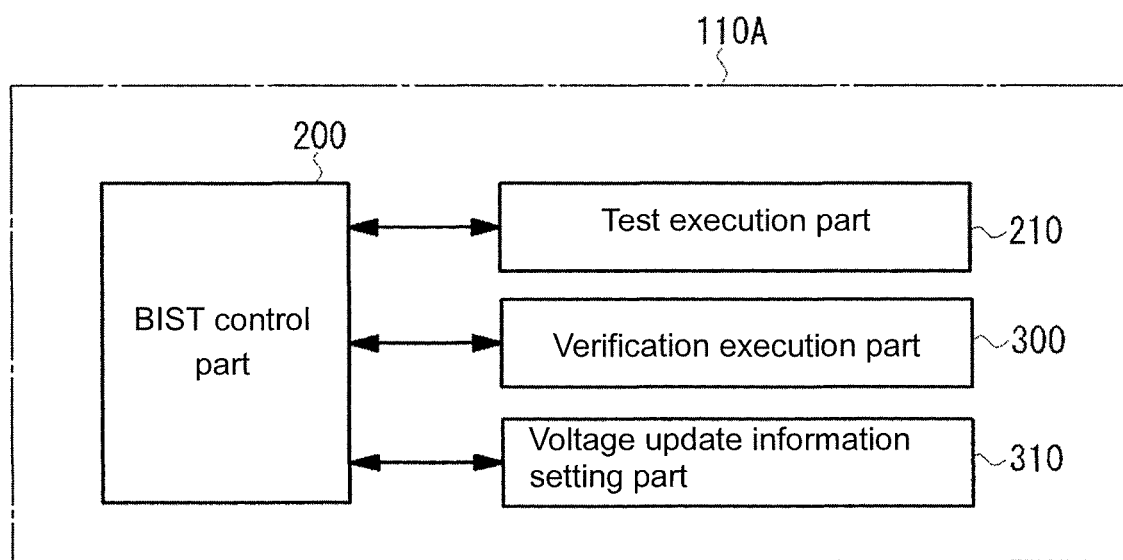
FIG. 8 is a graph of the inner structure of a BIST circuit of the fourth embodiment of the disclosure.

In the following, the fourth embodiment of the disclosure is described. FIG. 8 is a graph of the structure of a BIST circuit 110A of the fourth embodiment. In the fourth embodiment, the memory 120 of the semiconductor device 100 includes a NOR or NAND flash memory. Moreover, the BIST circuit 110A of the present embodiment includes a BIST control part 200, a test execution part 210, a verification execution part 300, and a voltage update information setting part 310.

The NOR or NAND flash memory is a memory device having a metal-oxide-semiconductor (MOS) structure, and the memory device of the MOS structure has a charge accumulation layer storing charge on the channel. When the semiconductor device 100 is surface-mounted on a circuit board via, for instance, IR reflow and when localized heat is applied to the semiconductor device, the charge state of the charge accumulation layer during shipping may be changed. If the charge state of the charge accumulation layer is changed, then the initial value of the programming pulse voltage or the initial value of the erase pulse voltage initially set may deviate from the optimal value. Therefore, when the BIST control part 200 executes the test of the semiconductor device 100, the flag of the voltage update information setting part 310 is set to "1", such that after the semiconductor device 100 is shipped and the power supply mounted on the circuit board is turned on for the first time, update of the initial value of the programming pulse voltage or erase pulse voltage can be performed. When the BIST control part 200 detects the power supply mounted on the circuit board is turned on for the first time, for instance, the verification execution part 300 is executed if a flag of "1" is set according to the information set by the voltage update information setting part 310 to change the initial value of the programming pulse and the erase pulse.

Figure 9:
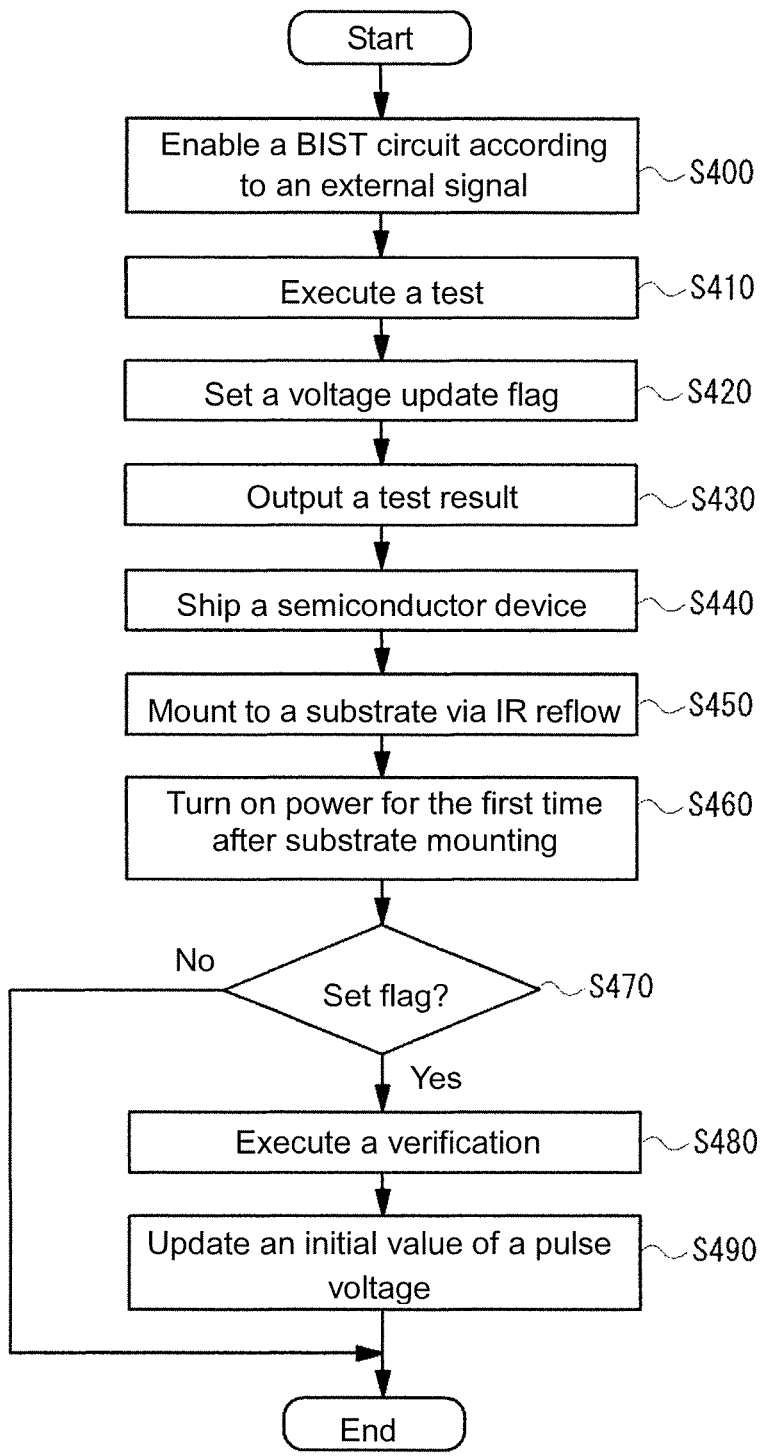
FIG. 9 is a flow chart of a voltage update operation of the fourth embodiment of the disclosure.

FIG. 9 is a graph of the process of the voltage update method of the semiconductor device of the fourth embodiment of the disclosure. The BIST circuit 110A is enabled according to, for instance, an external signal such as an enabling signal (S400), and a test of the memory 120 or internal circuit of the semiconductor device 100 is executed via the test execution part 410 (S410). The BIST control part 200 automatically sets the flag of the voltage update information setting part 310 to "1" when the test of the test execution part 210 is ended (S420). Next, the BIST control part 200 outputs the test result to the outside via the external interface 130 (S430) and ships the pass semiconductor device 100 (S440).

The shipped semiconductor device 100 is mounted on a circuit board via IR reflow (S450), and after the mounting, when the semiconductor device is powered on for the first time, the BIST control part 200 detects the power supply is turned on (S460) and responds to the test and references the information set by the voltage update information setting part 310 (S470). For instance, if the flag is set to "1", then the verification execution part 300 executes a verification (S480). The verification execution part 300 controls, for instance, a row selection circuit, column selection circuit and voltage generation circuit in the memory 120, such as performing data "0" programming on the memory device for monitoring and confirming whether the number of applications for the pass programming pulse in the programming verification is a certain number or less. If a certain number or more is reached, then the set value is updated by increasing the initial value of the programming pulse (S490). In the case that the initial value of the programming pulse is increased, the set value is updated by also increasing the initial value of the erase pulse.

Therefore, according to an embodiment of the disclosure, when the BIST circuit is in operation before product shipping, the voltage is set and information is updated, and the programming or erase voltage is updated when the power supply is turned on after product shipping. Therefore, even after product shipping and the heat of, for instance, IR reflow is applied to the memory device and the characteristics of the device are changed, the set value can still be updated to the optimal programming voltage and erase voltage according to the characteristics of the device.

Preferred embodiments of the disclosure are described in detail, but the disclosure is not limited to the specific embodiments, and various modifications and changes can be made within the scope of the disclosure recited in the claims.

What is claimed is:

1. An adjustment method of a semiconductor device, which is an adjustment method of a semiconductor device comprising a built-in self-test circuit, wherein the adjustment method comprises:
    a setting step setting an information of whether an adjustment is performed on a property of the semiconductor device when the built-in self-test circuit performs a forming operation on a non-volatile memory of the semiconductor device;
    a detection step detecting a turned on situation of a power supply; and
    an adjustment step adjusting the property of the semiconductor device based on the information set in the setting step and the built-in self-test circuit performing a reforming operation on the non-volatile memory based on an adjusted property of the semiconductor device when the detection step detects the power supply is turned on.

2. The adjustment method of claim 1, wherein:
    the setting step automatically sets the information of performing the adjustment on the property of the semiconductor device when the property of the semiconductor device is adjusted via the built-in self-test circuit,
    the setting step sets the information based on a test result of the built-in self-test circuit.

3. The adjustment method of claim 1, wherein:
    the detection step detects an initial power on of a power supply mounted on a circuit board.

4. The adjustment method of claim 1, wherein:
    the semiconductor device comprises an external terminal to be surface-mounted on a circuit board, and the external terminal is reflowed to a conductive region of the circuit board.

5. The adjustment method of claim 1, wherein:
    the adjustment step is a forming step of a reversible and non-volatile resistive random-access memory.

6. A semiconductor device comprising a built-in self-test circuit, wherein the semiconductor device comprises:
    a setting part setting an information of whether an adjustment is performed on a property of the semiconductor device when the built-in self-test circuit performs a forming operation on a non-volatile memory of the semiconductor device;
    a detection part detecting a turned on situation of a power supply; and
    an adjustment part adjusting the property of the semiconductor device based on the information set by the setting part and the built-in self-test circuit performing a reforming operation on the non-volatile memory based on an adjusted property of the semiconductor device when the detection part detects the power supply is turned on.

7. The semiconductor device of claim 6, wherein:
    the setting part automatically sets an information used for adjusting the property of the semiconductor device again when the property of the semiconductor device is adjusted.

8. The semiconductor device of claim 6, wherein:
    the built-in self-test circuit comprises the detection part and the adjustment part.

9. The semiconductor device of claim 6, wherein:
    the semiconductor device comprises an external terminal to be surface-mounted on a circuit board,
    the semiconductor device comprises a resistive random-access memory storing a data for a reversible and non-volatile variable resistance element, and
    the adjustment part is used for forming a circuit path between electrodes of the reversible and non-volatile variable resistance element.

* * * * *